United States Patent
Yoo et al.

(10) Patent No.: US 9,496,219 B2
(45) Date of Patent: Nov. 15, 2016

(54) SEMICONDUCTOR PACKAGE INCLUDING AN ANTENNA FORMED IN A GROOVE WITHIN A SEALING ELEMENT

(71) Applicant: SAMSUNG ELECTRO-MECHANICS CO., LTD., Suwon (KR)

(72) Inventors: Do Jae Yoo, Suwon (KR); Jung Ho Yoon, Anyang (KR); Chul Gyun Park, Yongin (KR); Myeong Woo Han, Hwaseong (KR); Jung Aun Lee, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 13/935,148

(22) Filed: Jul. 3, 2013

(65) Prior Publication Data

US 2013/0292809 A1    Nov. 7, 2013

Related U.S. Application Data

(62) Division of application No. 13/200,335, filed on Sep. 23, 2011, now abandoned.

(30) Foreign Application Priority Data

Jul. 7, 2011    (KR) .......................... 10-2011-0067437

(51) Int. Cl.
*H01L 23/02*    (2006.01)
*H01L 23/12*    (2006.01)
(Continued)

(52) U.S. Cl.
CPC ......... *H01L 23/5226* (2013.01); *H01L 21/561* (2013.01); *H01L 21/565* (2013.01); *H01L 21/568* (2013.01); *H01L 23/49827* (2013.01); *H01L 23/5389* (2013.01); *H01L 23/66* (2013.01); *H01L 24/19* (2013.01); *H01L 24/96* (2013.01); *H01L 24/97* (2013.01); *H01L 21/56* (2013.01); *H01L 24/73* (2013.01); *H01L 25/0657* (2013.01); *H01L 25/16* (2013.01); *H01L 2223/6677* (2013.01);
(Continued)

(58) Field of Classification Search
None
See application file for complete search history.

(56) References Cited

U.S. PATENT DOCUMENTS 5,353,498 A    10/1994    Fillion et al.
6,236,366 B1    5/2001    Yamamoto et al.
(Continued)

FOREIGN PATENT DOCUMENTS

JP    2006-101494    4/2006
JP    2009-158742    7/2009
(Continued)

OTHER PUBLICATIONS

U.S. Office Action issued on Aug. 15, 2013 in copending U.S. Appl. No. 13/775,337.
(Continued)

*Primary Examiner* — Mohammad Islam
*Assistant Examiner* — Jay C Chang
(74) *Attorney, Agent, or Firm* — NSIP Law

(57) ABSTRACT

A semiconductor package including an antenna formed integrally therewith. The semiconductor package includes: a semiconductor chip; a sealing part sealing the semiconductor chip; a substrate part formed on at least one surface of the sealing part; and an antenna part formed on the sealing part and electrically connected to the semiconductor chip.

8 Claims, 7 Drawing Sheets

(51) Int. Cl.

| | | |
|---|---|---|
| *H01L 23/48* | (2006.01) | |
| *H01L 23/52* | (2006.01) | |
| *H01L 23/40* | (2006.01) | |
| *H01L 23/522* | (2006.01) | |
| *H01L 23/498* | (2006.01) | |
| *H01L 21/56* | (2006.01) | |
| *H01L 23/538* | (2006.01) | |
| *H01L 23/66* | (2006.01) | |
| *H01L 23/00* | (2006.01) | |
| *H01L 21/00* | (2006.01) | |
| *H05K 1/18* | (2006.01) | |
| *H01L 25/065* | (2006.01) | |
| *H01L 25/16* | (2006.01) | |

(52) U.S. Cl.
CPC .......... *H01L 2224/0401* (2013.01); *H01L 2224/04105* (2013.01); *H01L 2224/16225* (2013.01); *H01L 2224/32145* (2013.01); *H01L 2224/48227* (2013.01); *H01L 2224/73265* (2013.01); *H01L 2224/97* (2013.01); *H01L 2924/01029* (2013.01); *H01L 2924/12042* (2013.01); *H01L 2924/15787* (2013.01); *H01L 2924/181* (2013.01); *H01L 2924/3011* (2013.01); *H05K 1/185* (2013.01); *H05K 2203/061* (2013.01)

(56) References Cited

U.S. PATENT DOCUMENTS

| | | | |
|---|---|---|---|
| 7,615,856 B2 | 11/2009 | Sakai et al. | |
| 7,675,465 B2 | 3/2010 | Doan et al. | |
| 7,843,052 B1 | 11/2010 | Yoo et al. | |
| 2006/0049995 A1 | 3/2006 | Imaoka et al. | |
| 2006/0157568 A1 | 7/2006 | Ato et al. | |
| 2006/0186531 A1 | 8/2006 | Hsu | 257/700 |
| 2007/0054506 A1 | 3/2007 | Libres et al. | |
| 2008/0128884 A1 | 6/2008 | Meyer et al. | |
| 2008/0142935 A1 | 6/2008 | Montoriol et al. | |
| 2008/0238784 A1* | 10/2008 | Ohashi et al. | 343/700 MS |
| 2009/0168367 A1 | 7/2009 | Fujii | |
| 2009/0289343 A1* | 11/2009 | Chiu | H01L 23/3128 257/690 |
| 2009/0322643 A1* | 12/2009 | Choudhury | 343/851 |
| 2010/0230806 A1 | 9/2010 | Huang et al. | 257/723 |
| 2010/0244216 A1 | 9/2010 | Huang et al. | |
| 2010/0302109 A1 | 12/2010 | Takezaki | |
| 2011/0186977 A1 | 8/2011 | Chi et al. | |

FOREIGN PATENT DOCUMENTS

| | | |
|---|---|---|
| KR | 10-1998-025895 | 7/1998 |
| KR | 10-2009-0071386 | 7/2009 |
| KR | 10-2011-0021427 | 3/2011 |

OTHER PUBLICATIONS

U.S. Office Action mailed Jul. 16, 2013 in related U.S. Appl. No. 13/200,335.
Korean Office Action issued Sep. 10, 2012 in corresponding Korean Patent application No. 10-2011-0067437.
U.S. Patent Restriction Requirement mailed Nov. 6, 2012 in parent U.S. Appl. No. 13/200,335.
U.S. Patent Office Action mailed Dec. 17, 2012 in parent U.S. Appl. No. 13/200,335.
Korean Office Action mailed Feb. 22, 2013 for corresponding Korean Application No. 10-2011-0067437.
U.S. Patent Office Action mailed Mar. 27, 2013 in parent U.S. Appl. No. 13/200,335.
U.S. Appl. No. 13/200,335, filed Jul. 7, 2011, Do Jae Yoo et al., Samsung Electro-Mechanics Co., Ltd.
U.S. Appl. No. 13/775,337, filed Feb. 25, 2013, Do Jae Yoo et al, Samsung Electro-Mechanics Co., Ltd.
Korean Office Action mailed Nov. 4, 2013 in related Korean Application No. 10-2011-0067437.
U.S. Office Action mailed Jan. 2, 2014 in related U.S. Appl. No. 13/775,337.
U.S. Patent Office Action mailed Nov. 22, 2013 in parent U.S. Appl. No. 13/200,335.
Office Action dated Jul. 31, 2014 in related U.S. Appl. No. 13/775,337.
U.S. Final Office Action issued on Dec. 18, 2014 in counterpart U.S. Appl. No. 13/775,337. (10 pages in English).
U.S. Non-Final Office Action issued on May 22, 2015 in counterpart U.S. Appl. No. 13/775,337. (11 pages in English).
U.S. Final Office Action issued on Oct. 8, 2015 in counterpart U.S. Appl. No. 13/775,337. (12 pages in English).
US Non-Final Office Action issued on Mar. 22, 2016 in counterpart U.S. Appl. No. 13/775,337. (12 pages in English).

* cited by examiner

SEMICONDUCTOR PACKAGE INCLUDING AN ANTENNA FORMED IN A GROOVE WITHIN A SEALING ELEMENT

CROSS-REFERENCE TO RELATED APPLICATIONS

This application is a U.S. divisional application filed under 37 CFR 1.53(b) claiming priority benefit of U.S. Ser. No. 13/200,335 filed in the United States on Sep. 23, 2011, pending, which claims earlier foreign priority benefit of Korean Patent Application No. 10-2011-0067437 filed with the Korean Intellectual Property Office on Jul. 7, 2011, the disclosures of which are incorporated herein by reference.

BACKGROUND

1. Field

The present invention relates to a semiconductor package and a method of manufacturing the same, and more particularly, to a semiconductor package including an antenna formed integrally therewith, and a method of manufacturing the same.

2. Description of the Related Art

As a frequency resource for a next generation information communication service, a frequency in the millimeter wave band, a super high frequency band of 30 GHz or more, has been actively studied.

This frequency in the millimeter wave band has advantages in that a large amount of information may be transferred at high speed using wideband characteristics and that the frequency may be re-used, that is, a band having the same frequency may be used without interference in an adjacent geographical area due to significant electrical wave attenuation in the air. Therefore, many researchers have been interested in the frequency in the millimeter wave band.

As a result, the development of an information communication service and system using the frequency in the millimeter wave as well as research into, and development of, various components required for the information communication service and system have been conducted.

In this millimeter wave band, an electrical connection distance between an antenna and a semiconductor chip is very important. That is, when a distance between the antenna and the semiconductor chip increases, loss increases. Therefore, an antenna in the millimeter wave band (particularly, the 60 GHz band) may be electrically connected to the semiconductor chip to be close thereto.

To this end, according to the related art, an antenna is disposed at a position significantly adjacent to a semiconductor package in which a semiconductor chip is embedded, and the antenna and the semiconductor package are electrically connected to each other at the shortest possible distance.

In the case of the related art, after the semiconductor package and the antenna are separately manufactured, they are mounted on a substrate and electrical connections are made. Therefore, a manufacturing process is complicated.

Accordingly, the demand for a structure in which an antenna and a semiconductor package are disposed at a closer distance to one other has increased. In addition, the necessity for a manufacturing method capable of simplifying a process has increased.

SUMMARY

An aspect of the present invention provides a semiconductor package capable of being easily manufactured while minimizing an electrical connection distance between an antenna and a semiconductor chip.

Another aspect of the present invention provides a method of manufacturing a semiconductor package through a simplified semiconductor manufacturing process.

Another aspect of the present invention provides a method of manufacturing a semiconductor package capable of producing a compact and thin semiconductor package through a semiconductor manufacturing process.

According to an aspect of the present invention, there is provided a semiconductor package including: a semiconductor chip; a sealing part sealing the semiconductor chip; a substrate part formed on at least one surface of the sealing part; and an antenna part formed on the sealing part or the substrate part and electrically connected to the semiconductor chip.

The semiconductor package may further include a via connection part penetrating through the sealing part, and the antenna part and the semiconductor chip may be electrically connected to each other through the via connection part.

The substrate part may include an upper substrate formed on an upper surface of the sealing part, and a lower substrate formed on a lower surface of the sealing part.

The antenna part may be formed on an outer surface of the upper substrate.

The upper substrate may be a multi-layer substrate, and the antenna part may include a plurality of radiators formed on several layers of the upper substrate.

The antenna part may be formed on an outer surface of the sealing part.

The antenna part may be formed in a groove formed in the outer surface of the sealing part.

The substrate part may have fine circuit patterns formed in an inner portion thereof through a semiconductor manufacturing process.

The semiconductor chip may transceive a high frequency in a millimeter wave band through the antenna part.

According to another aspect of the present invention, there is provided a method of manufacturing a semiconductor package, the method including: disposing a plurality of semiconductor chips; forming a sealing part sealing the plurality of semiconductor chips; forming a substrate part on at least one surface of the sealing part; and forming an antenna part on the sealing part or the substrate part.

The disposing of the plurality of semiconductor chips may include arranging semiconductor chips sorted into good products on a carrier.

The disposing of the plurality of semiconductor chips may include attaching the semiconductor chips to an adhesive layer formed on the carrier.

The forming of the sealing part may include forming the sealing part using an epoxy mold compound (EMC).

The method may further include, after the forming of the sealing part, forming a via connection part penetrating through the sealing part.

The forming of the antenna part may include electrically connecting the antenna part and the semiconductor chips through the via connection part.

The forming of the substrate part may include forming a multi-layer substrate part on each of upper and lower surfaces of the sealing part.

The forming of the antenna part may include forming a plurality of radiators on several layers of the substrate part.

The forming of the antenna part may include forming a groove in an outer surface of the sealing part and forming the antenna part therein.

The forming of the substrate part may include repeatedly forming fine circuit patterns and insulating layers through a semiconductor manufacturing process.

BRIEF DESCRIPTION OF THE DRAWINGS

The above and other aspects, features and other advantages of the present invention will be more clearly understood from the following detailed description taken in conjunction with the accompanying drawings, in which.

DESCRIPTION OF EMBODIMENTS

Figure 1:
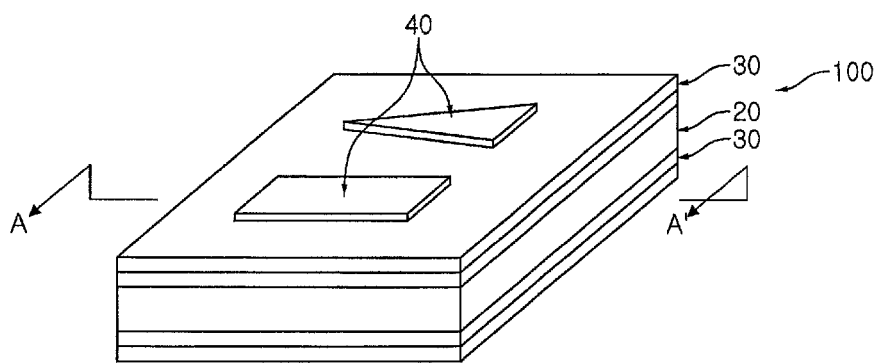
FIG. 1 is a perspective view schematically showing a semiconductor package according to an embodiment of the present invention.

Prior to a detailed description of the present invention, the terms or words, which are used in the specification and claims to be described below, should not be construed as having typical or dictionary meanings. The terms or words should be construed in conformity with the technical idea of the present invention on the basis of the principle that the inventor(s) can appropriately define terms in order to describe his or her invention in the best way. Embodiments described in the specification and structures illustrated in drawings are merely exemplary embodiments of the present invention. Thus, it is intended that the present invention covers the modifications and variations of this invention, provided they fall within the scope of their equivalents at the time of filing this application.

Exemplary embodiments of the present invention will be described in detail with reference to the accompanying drawings. The same reference numerals will be used throughout to designate the same or like elements in the accompanying drawings. Moreover, detailed descriptions related to well-known functions or configurations will be ruled out in order not to unnecessarily obscure subject matters of the present invention. In the drawings, the shapes and dimensions of some elements may be exaggerated, omitted or schematically illustrated. Also, the size of each element does not entirely reflect an actual size.

Hereinafter, embodiments of the present invention will be described in detail with reference to the accompanying drawings.

Figure 2:
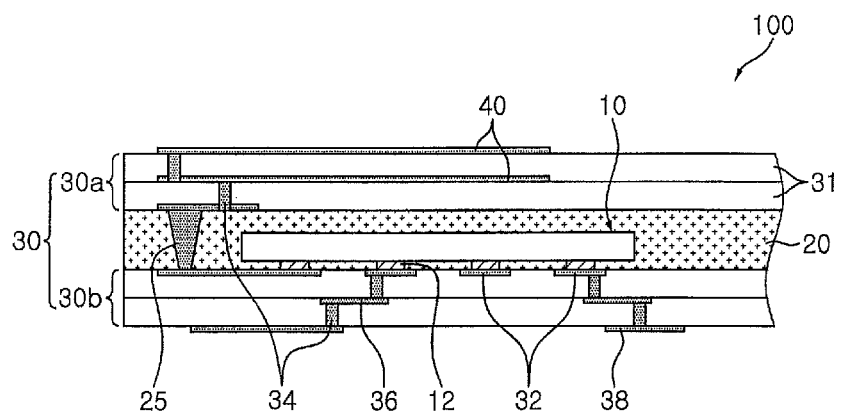
FIG. 2 is a cross-sectional view taken along line A-A' of the semiconductor package shown in FIG. 1.

FIG. 1 is a perspective view schematically showing a semiconductor package according to an embodiment of the present invention, and FIG. 2 is a cross-sectional view taken along line A-A' of the semiconductor package shown in FIG. 1.

As shown in FIGS. 1 and 2, a semiconductor package 100 according to the present embodiment includes a semiconductor chip 10, a sealing part 20 sealing the semiconductor chip 10, a substrate part 30 disposed on both surfaces of the sealing part 20, and an antenna part 40.

The semiconductor chip 10 includes a plurality of connection pads 12 for connecting to the outside and is electrically connected to the substrate part 30 and the antenna part 40 (to be described below) through the connection pads 12. The connection pads 12 may have the form of a solder bump. However, the present invention is not limited thereto but may be variously applied. For example, the connection pads 12 may have the form of a pad for wire bonding.

This semiconductor chip 10 may perform wireless communications with the outside through the antenna part 40.

The sealing part 20 encloses the entire semiconductor chip 10 such that the semiconductor chip 10 is embedded therein, thereby sealing the semiconductor chip 10. That is, the sealing part 20 encloses an outer portion of the semiconductor chip 10 and fixes the semiconductor chip 10 to the substrate part 30, thereby securely protecting the semiconductor chip 10 from external impacts.

As a method of forming the sealing part 20, a molding method may be used. In this case, an epoxy mold compound (EMC) may be used as a material of the sealing part 20. However, the present invention is not limited thereto. That is, various methods such as a printing method, a spin coating method, a jetting method, and the like, may be used for forming the sealing part 20 as necessary.

The substrate part 30 may be formed on at least one surface of the sealing part 20 having the semiconductor chip 10 embedded therein. The present embodiment describes a case in which the substrate part 30 includes each of upper and lower substrates 30a and 30b formed on both surfaces (upper and lower surfaces) of the sealing part 20 by way of example. As the substrate part 30, various kinds of substrates (for example, a silicon substrate, a ceramic substrate, a printed circuit board (PCB), a flexible substrate, a circuit pattern layer by a semiconductor circuit process, and the like) known in the art may be used.

Electrode patterns 32 electrically connected to the semiconductor chip 10 and circuit patterns 36 electrically connecting the electrode patterns 32 to each other may be formed on one surface of the substrate part 30, that is, a bonding surface between the substrate part 30 and the sealing part 20.

In addition, the substrate part 30 according to the present embodiment may be a multi-layer substrate configured of a plurality of layers. The circuit patterns 36 for forming an electrical connection may be formed between the respective layers. The substrate part 30 may have external electrodes 38 formed on an outer surface thereof, and the external electrodes 38 electrically connect the semiconductor package 100 to the outside.

In addition, the substrate part 30 according to the present embodiment may include the external electrodes 38, the electrode patterns 32 and conductive vias 34 electrically connecting the circuit patterns 36 to each other.

Here, the substrate part 30 according to the present embodiment may be formed through a semiconductor manufacturing process. Therefore, the external electrode 38, the electrode pattern 32, the circuit pattern 36, the conductive via 34, and the like, formed in the substrate part 30 may be formed as fine circuit patterns by the semiconductor manufacturing process.

The antenna part 40 is formed by disposing a radiator on the outer surface of the substrate part 30, that is, a top portion. The form of the radiator may be varied, having a liner, polygonal, circular, or other shape, and may be a dipole or monopole form.

The antenna part 40 according to the present embodiment may be formed to have a single radiator or be formed by complexly disposing a plurality of radiators on several layers as necessary. FIG. 2 shows a case in which the radiators are formed in parallel with each other on the outer surface of the substrate part 30 and an inner portion of the substrate part 30.

In addition, the antenna part 40 may be electrically connected to the semiconductor chip 10 through the circuit pattern 36, the via 34, a via connection part 25, and the like.

Meanwhile, although the present embodiment describes a case in which the antenna part 40 is formed in the upper substrate 30*a* by way of example, the present invention is not limited thereto. That is, the antenna part 40 may also be disposed on an outer surface of the lower substrate 30*b*, that is, a bottom surface of the lower substrate 30*b* in order to minimize an electrical connection distance between the antenna part 40 and the semiconductor chip 10.

In the case of the semiconductor package 100 configured as described above, the antenna part 40 is formed on the outer surface of the substrate part 30 and an electrical connection distance between the antenna part 40 and the semiconductor chip 10 is significantly short, whereby radiation characteristics and electrical loss of the antenna part 40 may be improved.

Next, a method of manufacturing a semiconductor package according to an embodiment of the present invention will be described.

Figure 3A:
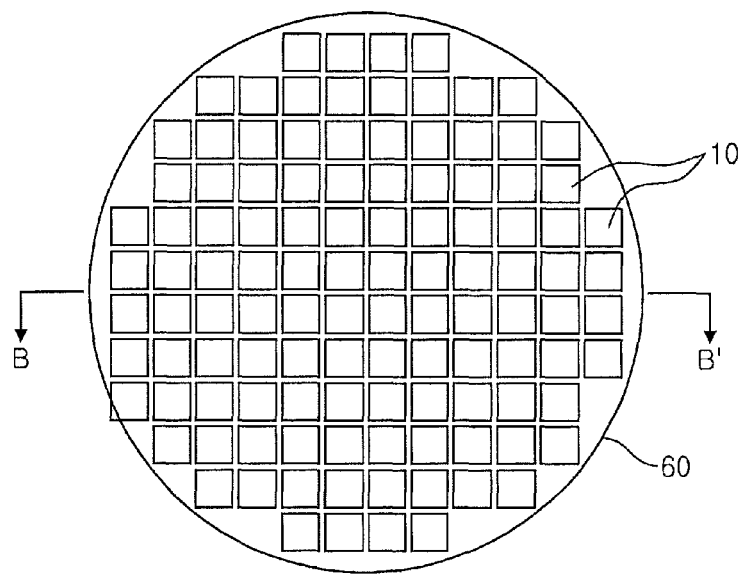
FIGS. 3A through 3I are views describing a method of manufacturing a semiconductor package according to an embodiment of the present invention.
Figure 3B:
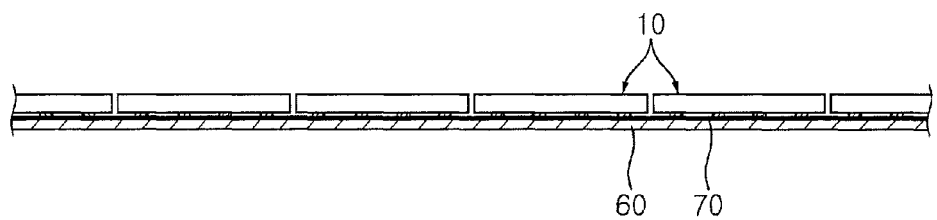
Figure 3C:
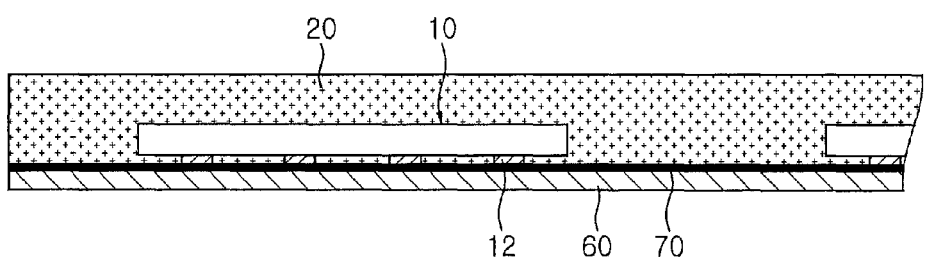
Figure 3D:
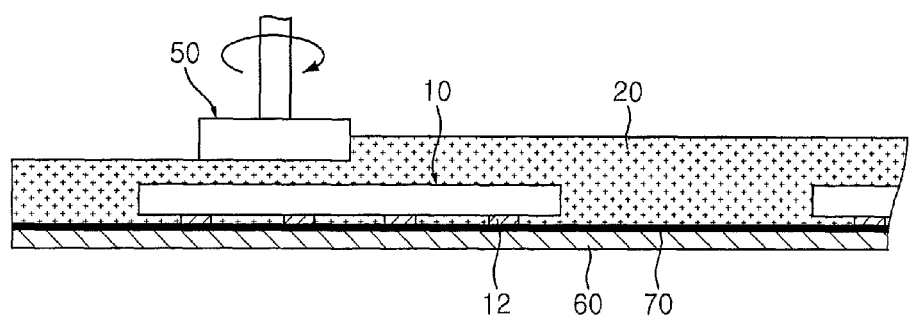
Figure 3E:
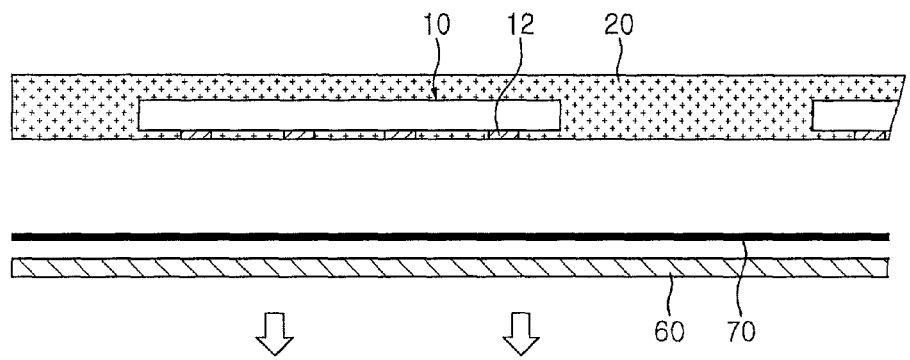
Figure 3F:
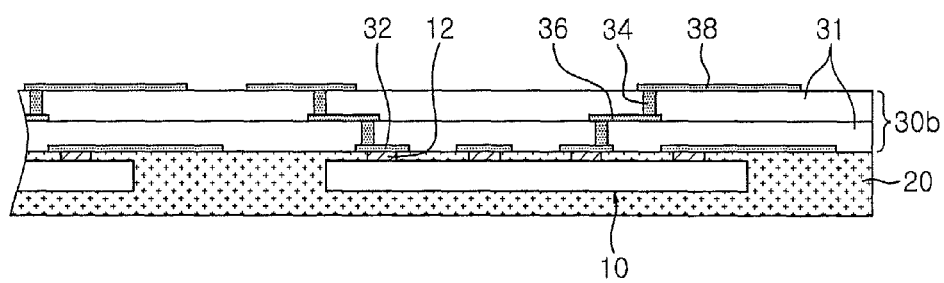
Figure 3G:
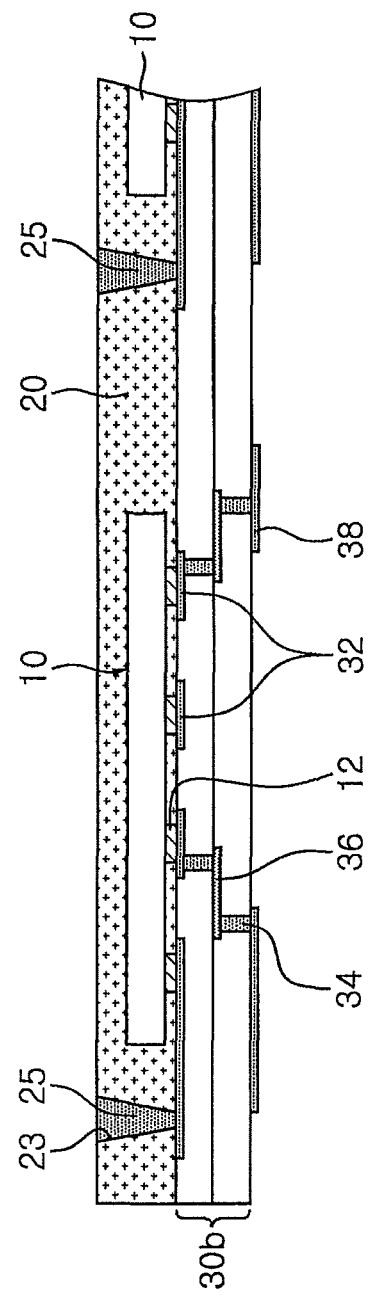
Figure 3H:
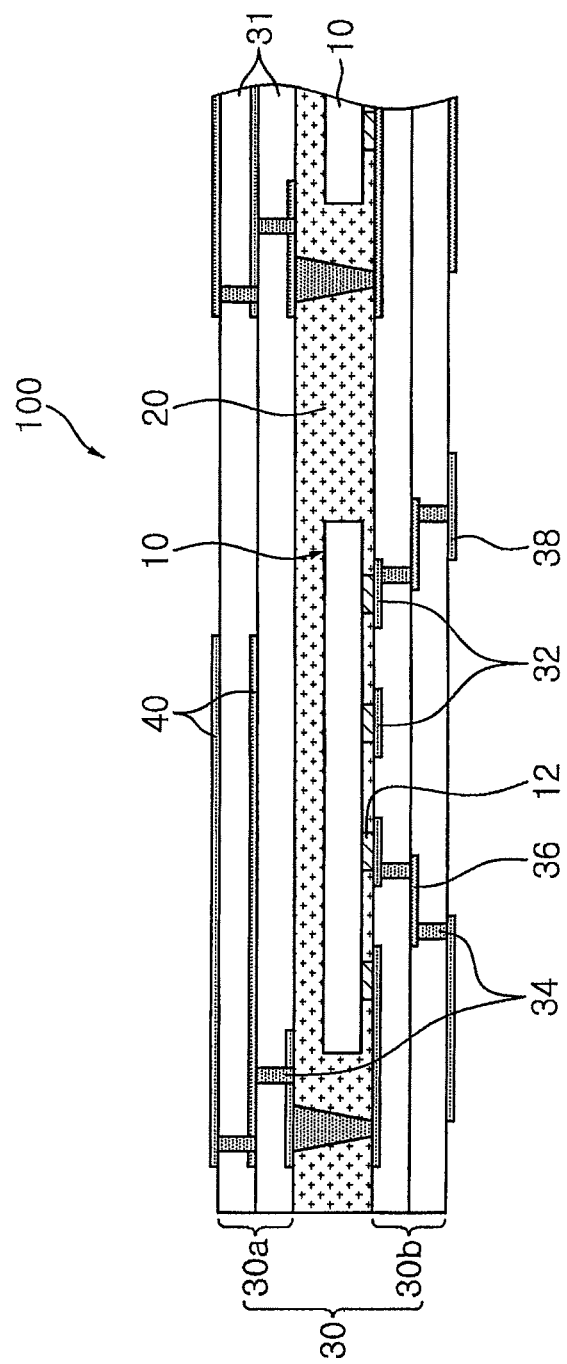
Figure 3I:
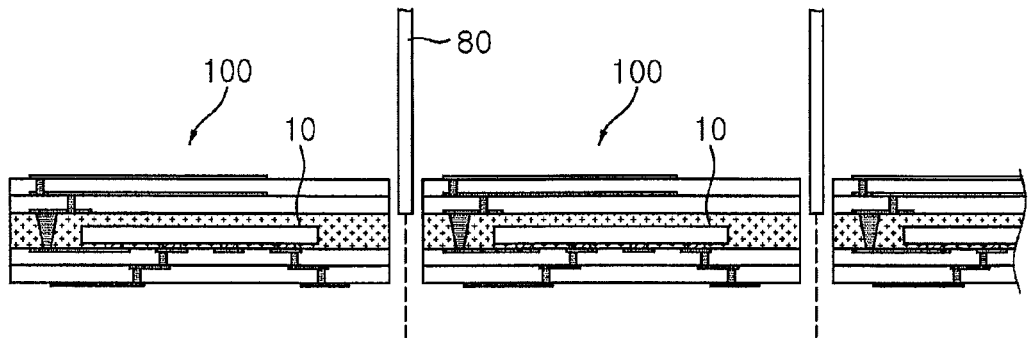
Figure 4:
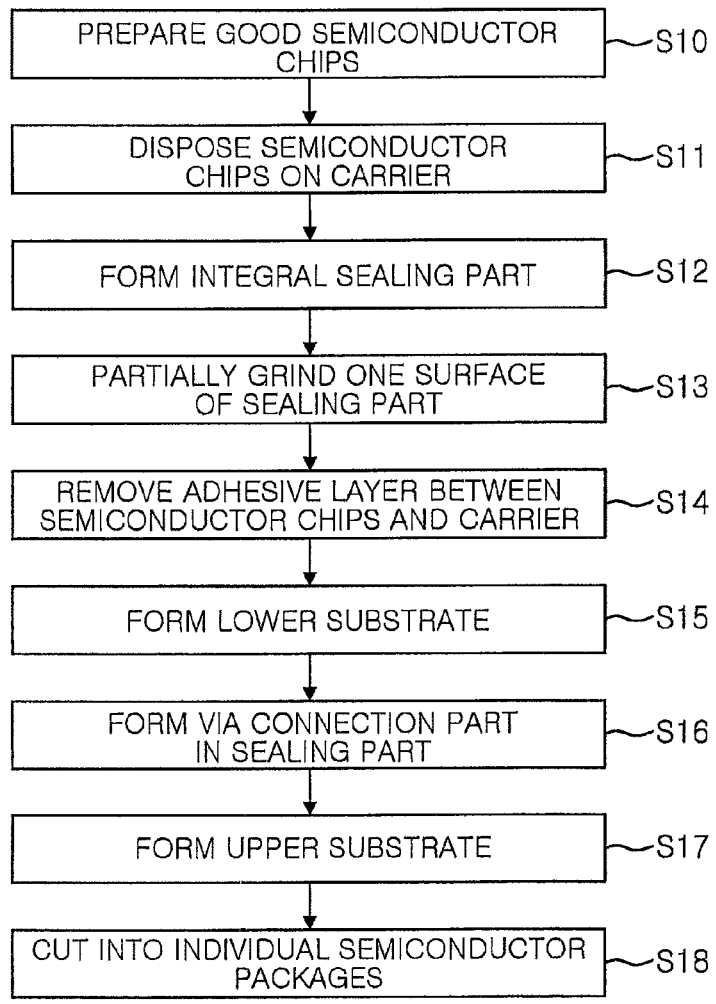
FIG. 4 is a flowchart showing a method of manufacturing a semiconductor package according to an embodiment of the present invention.

FIGS. 3A through 3I are views describing a method of manufacturing a semiconductor package according to an embodiment of the present invention; and FIG. 4 is a flowchart showing a method of manufacturing a semiconductor package according to an embodiment of the present invention.

With reference to FIGS. 3A through 4, a method of manufacturing a semiconductor package according to an embodiment of the present invention in initiated in preparing the semiconductor chip 10 in operation S10.

A plurality of semiconductor chips formed on a wafer may be cut into individual chips through a known semiconductor manufacturing process and then the individual chips may be sorted into a good product or a bad product.

Then, as shown in FIGS. 3A and 3B, the plurality of semiconductor chips 10 are disposed in operation S11. Here, FIG. 3B shows a cross-sectional view taken along line B-B' of FIG. 3A.

The semiconductor chips 10 may be disposed such that they are uniformly arranged on a carrier 60 having various shapes.

The carrier 60 includes an adhesive layer 70 formed on one surface thereof, and the semiconductor chips 10 are mounted on the adhesive layer 70. Here, the semiconductor chips 10 are mounted such that active areas thereof having the connection pads 12 formed therein may be attached to the adhesive layer 70 of the carrier 60.

The adhesive layer 70 may have adhesion changed by light or heat. As an example, adhesive tape may be used. However, the present invention is not limited thereto but may be variously applied. The adhesive layer 70 may be formed by applying an adhesive resin, or the like, to one surface of the carrier 60.

The carrier 60 may be formed of a flat, hard wafer disk. However, this configuration in which the carrier 60 uses the wafer was deduced because the method of manufacturing the semiconductor package 100 according to the present embodiment utilizes a semiconductor manufacturing process using a wafer. Therefore, the carrier 60 according to the present embodiment is not limited to having a circular shape but may be variously shaped according to embodiments of the semiconductor manufacturing process. Although FIG. 3A shows a good chip carrier having the circular shape, the carrier 60 may have various forms including a rectangular substrate.

After the plurality of semiconductor chips 10 are mounted on the carrier 60, the sealing part 20 is formed in operation S12 as shown in FIG. 3C.

The sealing part 20 according to the present embodiment covers the entire carrier 60. That is, the sealing part 20 fills spaces between the individual semiconductor chips 10. Therefore, when the forming of the sealing part 20 is completed, all of the semiconductor chips 10 are formed integrally with each other by the sealing part 20.

After the carrier 60 on which the semiconductor chips 10 are mounted is disposed within a mold (not shown), the sealing part 20 according to the present embodiment may be formed by injecting a mold resin into the mold and hardening it.

Next, as shown in FIG. 3D, one surface of the sealing part 20 is ground using a grinder 50 in operation S13. Therefore, an unnecessary portion of the sealing part 20 is removed, whereby the thickness of the semiconductor package 100 may be reduced.

In addition, in the semiconductor package 100 according to the present embodiment, a distance between the antenna part 40 and the semiconductor chips 10, permittivity according to the distance, and the like, may be adjusted through the grinding of the sealing part 20. Therefore, characteristics of the antenna part 40, that is, signal matching characteristics may be optimally adjusted through this operation S13.

Accordingly, the unnecessary portion of the sealing part 20 may be removed corresponding to optimal signal matching.

Meanwhile, when the adjustment of a thickness of the sealing part 20 or signal matching is not required to be performed, this operation may be omitted.

Thereafter, as shown in FIG. 3E, the removing of the adhesive layer 70 is performed in operation S14. This may be easily undertaken by applying heat to the adhesive layer 70 or irradiating the adhesive layer 70 with light to weaken the adhesion thereof. The adhesive layer 70, attached to the other surface of the sealing part 20, is removed, such that the connection pads 12 of the semiconductor chips 10 that have been attached to the adhesive layer 70 are exposed to the outside on the other surface of the sealing part 20.

Meanwhile, a lower surface of the sealing part 20 in which the adhesive layer is removed may be continuously supported by the carrier 60. However, hereinafter, for convenience of description, the carrier 60 may be omitted in the drawings.

Then, at least one substrate part 30 may be formed on any one surface of the sealing part 20. The present embodiment describes a case in which the lower substrate 30*b* is first formed in operation S15 by way of example as shown in FIG. 3F.

The sealing part 20 is disposed in a form in which upper and lower surfaces thereof are inverted. That is, the sealing part 20 is mounted on the carrier such that the connection pad 12 of the semiconductor chip 10 is exposed upwardly.

The lower substrate 30*b* may be formed by repeatedly performing a process of forming the circuit patterns 36, the electrode patterns 32, or the like, on the upper surface of the sealing part 20, on which the connection pad 12 is exposed, and forming an insulating layer 31 thereon again. At this time, the electrode patterns 32 or the circuit patterns 36 may be formed to be electrically connected to the connection pads 12 exposed on the sealing part 20.

In addition, the vias 34 penetrating through the insulating layers 31 may be formed as necessary to thereby electrically connect the respective insulating layers 31, and the external electrodes 38 for connection to the outside may be formed on an outer surface of the insulating layer 31.

Here, as a method of forming the circuit pattern 36, the insulating layer 31, the via 34, or the like, a semiconductor manufacturing process known in the art, or the like, may be used. Therefore, a detailed description thereof will be omitted.

When the substrate part 30 is formed using the semiconductor manufacturing process as in the present embodiment, fine circuit patterns may be formed on the substrate part 30. In addition, the substrate part may have a significantly reduced thickness as compared to a general printed circuit board (PCB). Therefore, the semiconductor chip 100 according to the present embodiment may be a chip scale package (CSP).

After the lower substrate 30b is formed, the via connection part 25 penetrating through the sealing part 20 is formed in operation S16 as shown in FIG. 3G. At this time, the via connection part 25 is formed at a position corresponding to that of the circuit pattern 36 formed on the lower substrate 30b. Therefore, the via connection part 25 may be electrically connected to the semiconductor chip 10 through the circuit pattern 36.

The via connection part 25 may be formed by drilling a through hole 23 in the sealing part 20, so that the circuit pattern 36 of the lower substrate 30b is exposed, filling the through hole 23 with a conductive material (for example, copper, solder, or the like) and hardening the conductive material. The through hole 23 may be formed using a method such as laser drilling. However, the through hole 23 is not limited to being formed using laser drilling, but may also be formed using other methods as required.

Meanwhile, the present embodiment describes a case in which the via connection part 25 is formed after the forming of the lower substrate 30b by way of example. However, the present invention is not limited thereto. That is, after the sealing part 20 is formed in operation S12 or S13, the via connection part 25 is first formed in the sealing part 20 before the forming of the lower substrate 30b.

Next, as shown in FIG. 3H, the upper substrate 30a is formed on one surface of the sealing part 20 in operation S17. The upper substrate 30a may be formed to have a shape similar to that of the above-mentioned lower substrate 30b through the same process as that of forming the lower substrate 30b.

First, the sealing part 20 is reinverted such that the connection pad 12 of the semiconductor chip 10 is directed downwardly. Then, the upper substrate 30a may be formed by repeatedly performing a process of forming the circuit patterns 36, the electrode patterns 32, or the like, on the upper surface of the sealing part 20 and forming the insulating layer 31 thereon again.

In this operation, the antenna part 40 may be formed on the upper substrate 30a.

The antenna part 40 may have the form of the circuit pattern 36 in a process of forming the circuit pattern 36 of the upper substrate 30a. In addition, the antenna part 40 may be electrically connected to the semiconductor chip 10 through the via 34 formed in the upper substrate 30a, the via connection part 25 formed in the sealing part 20, or the like.

Since the antenna part 40 as well as the substrate part 30 may be formed during the process of forming the substrate part 30 as described above, a manufacturing process may be facilitated as compared to the case of the related art in which the antenna part 40 is separately manufactured and then coupled to the substrate part 30.

Further, in the antenna part 40 according to the present embodiment, at least one radiator may have the form of the circuit pattern 36 in the inner portion of the upper substrate 30a as well as on the outer surface of the upper substrate 30a in order to secure radiation characteristics and impedance bandwidth required for wireless communications.

After the upper substrate 30a is formed, the individual semiconductor packages 100 are formed in operation S18 as shown in FIG. 3I. The semiconductor chips 10 are separated by being cut therebetween using a cutting blade 80, a laser beam, or the like, such that the semiconductor chips 10 formed integrally by the sealing part 20 are individually separated. As a result, the individual semiconductor packages 100 as shown in FIG. 1 are formed.

With the semiconductor package and the method of manufacturing the same according to the present embodiment configured as described above, only good semiconductor chips are sorted from the individual semiconductor chips 10 and are rearranged to manufacture the semiconductor package, whereby reliability may be secured.

In addition, the substrate part 30 formed on both surfaces (that is, upper and lower surfaces) of the semiconductor package 100 is utilized, whereby the semiconductor package may be miniaturized and system in package may be implemented.

Further, the sealing of the semiconductor chip 10 is used to thereby protect the semiconductor chip 10 from the outside, whereby the semiconductor chips 10 having various forms such as a flip chip, a chip using a wire bonding scheme, or the like, may be utilized.

Furthermore, in the semiconductor package 100 according to the present embodiment, the antenna part 40 and the semiconductor chip 10 are disposed adjacent to each other to be formed integrally, whereby an electrical connection distance between the semiconductor chip 10 and the antenna part 40 may be minimized. Therefore, when the semiconductor package 100 according to the present embodiment is used in the millimeter wave band (particularly, 60 GHz band), loss generated between the antenna part 40 and the semiconductor chip 10 may be minimized.

In addition, the method of manufacturing a semiconductor package according to the present embodiment forms the antenna part 40 during the process of forming the substrate part 30, whereby the number of manufacturing processes and a manufacturing costs may be reduced as compared to the case of the related art in which the antenna part is separately manufactured and then coupled to the substrate part.

Further, the method of manufacturing a semiconductor package according to the present embodiment uses a semiconductor manufacturing process. Therefore, the semiconductor manufacturing equipment according to the related art may be utilized, whereby a requirement for investment in new equipment for manufacturing the semiconductor package may be minimized. In addition, fine circuit patterns are formed on a substrate through the semiconductor manufacturing process, whereby the semiconductor package 100 may be miniaturized and thinned. Further, a general semiconductor manufacturing process is utilized, whereby the semiconductor package may be easily manufactured.

In addition, a sealing technology having high reliability is used, whereby reliability for packaging of the semiconductor chip 10 may be secured.

Furthermore, the sealing part 20 is ground to adjust a thickness thereof and the antenna part 40 is then formed, whereby characteristics of the antenna part 40 may be adjusted. Therefore, the signal matching of the antenna part 40 may be performed during a manufacturing process.

Meanwhile, although the present embodiment describes the substrate part 30 as being formed on both surfaces with respect to a single semiconductor chip 10, the present invention is not limited thereto. In the case in which a plurality of semiconductor chips 10 are embedded such as the case in which the semiconductor chips 10 are stacked, or the like, a ratio of a system in package may be increased.

The semiconductor package and the method of manufacturing the same according to the present invention may be variously applied.

Figure 5:
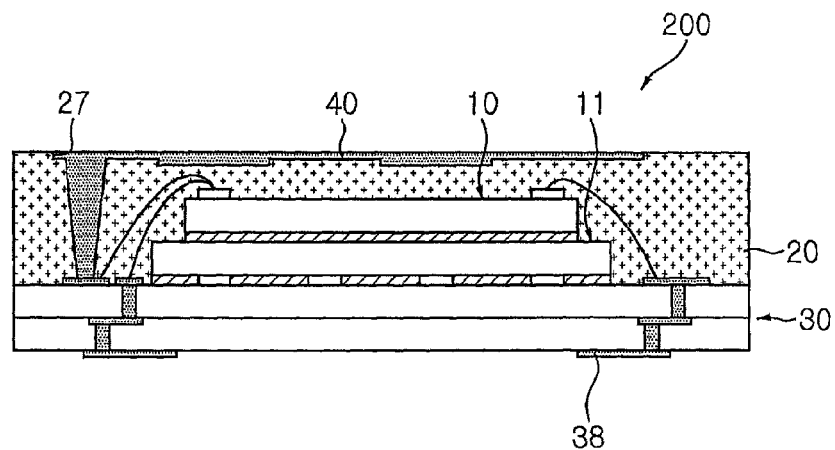
FIGS. 5 and 6 are cross-sectional views schematically showing a semiconductor package according to other embodiments of the present invention.
Figure 6:
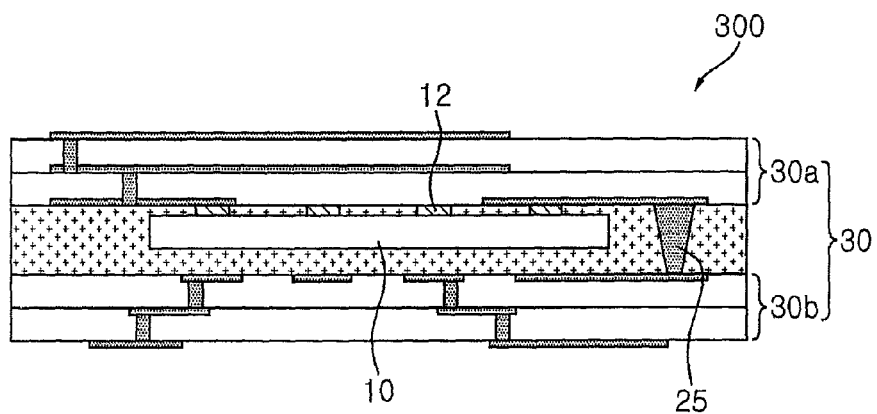

FIGS. 5 and 6 are cross-sectional views schematically showing a semiconductor package according to other embodiments of the present invention.

First, referring to FIG. 5, a semiconductor package 200 according to the present embodiment is different from the semiconductor package 100 according to the above-mentioned embodiment in terms of a configuration in which a plurality of semiconductor chips 10 and 11 are mounted while being stacked, a configuration in which the semiconductor chip 10 is electrically connected to the substrate part 30 through a wire bonding scheme, and a configuration in which the antenna part 40 is directly formed on the sealing part 20 rather than the upper substrate 30*a* (See FIG. 2).

Particularly, in the semiconductor package 200 according to the present embodiment, after the thickness of the sealing part 20 may be adjusted using a grinder, or the like, and a a groove 27 may be formed using a laser beam, or the like, a radiator of the antenna part 40 may be then formed to have a circuit pattern form in the groove 27.

Meanwhile, when a depth of the groove 27 is variously formed using the laser beam, or the like, and the antenna part 40 is then formed in an inner portion of the groove 27 as shown in FIG. 5, the radiator of the antenna part 40 may have various thicknesses.

The above-mentioned configuration may be realized by adding the forming of the groove 27 in one surface of the sealing part 20. The forming of the groove 27 may be undertaken after operation S13 of grinding one surface of the sealing part 20 as described above or may be performed without operation S13.

As described above, the semiconductor package 200 according to the present embodiment may utilize the semiconductor chips 10 having various shapes, and the substrate part 30 having various shapes.

In the case in which the antenna part 40 is formed as described above, the depth of the groove 27 in which the antenna part 40 is formed is adjusted, whereby characteristics of the antenna part 40 may be adjusted.

However, the present invention is not limited thereto. For example, the antenna part 40 may also be formed without forming the groove 27 in the sealing part 20. In this case, the number of manufacturing processes may be reduced.

Referring to FIG. 6, a semiconductor package 300 according to the present embodiment is different from the semiconductor package 100 (See FIG. 2) according to the above-mentioned embodiment only in that an active area of the semiconductor chip 10 in which the connection pad 12 is formed is disposed to face the upper substrate 30*a*. In the case in which the semiconductor package 300 is configured as described above, an electrical distance between the semiconductor chip 10 and the antenna part 40 is shorter than that of the above-mentioned semiconductor package 100 shown in FIG. 2.

In addition, the via connection part 25 that has been used to electrically connect the semiconductor chip 10 and the antenna part 40 to each other is not used, whereby electrical loss may be further reduced.

The semiconductor package and the method of manufacturing the same according to the present invention as described above are not limited to the above-mentioned embodiments but may be variously applied. For example, although the above-mentioned embodiments describe a case in which the substrate part is formed through the semiconductor manufacturing process by way of example, various methods may be applied thereto. For example, the substrate part may also be formed using a general method of manufacturing a printed circuit board.

In addition, although the above-mentioned embodiments describe a case in which the semiconductor package is manufactured by disposing the semiconductor chips on the carrier by way of example, the present invention is not limited thereto.

That is, a separate substrate (hereinafter, referred to as a support substrate) rather than the carrier may also be used. A detailed description thereof will be provided below.

The semiconductor chips may be mounted on the support substrate, on which electrode patterns are formed, instead of the carrier. In this case, the separate adhesive layer 70 (See FIG. 3B) is not used unlike in the case of the above-mentioned embodiment, and the respective semiconductor chips may be mounted on the support substrate while having separate connection pads directly bonded to the electrode patterns formed on the support substrate.

In addition, a support substrate on which circuit patterns or electrode patterns are not formed may also be formed. In this case, the semiconductor chips are mounted on and fixed to one surface of the support substrate, through holes are formed in the support substrate at positions corresponding to positions at which the connection pads of the semiconductor chips are disposed, and circuit patterns formed on the other surface of the support substrate are electrically connected to the connection pads through the through holes.

Therefore, when the support substrate is used as described above, the process of removing the adhesive layer in the above-mentioned embodiment may be omitted, and the support substrate may be directly formed as the substrate part. In addition, the substrate part may be formed as a multi-layer substrate by repeatedly forming new insulating layers and circuit patterns on the outer surface of the support substrate as necessary.

As set forth above, with the semiconductor package and the method of manufacturing the same according to the embodiments of the present invention, only good semiconductor chips are sorted among the individual semiconductor chips and then rearranged to manufacture the semiconductor package, whereby reliability of a product may be secured.

In addition, a scheme of sealing the semiconductor chip to thereby protect the semiconductor chip from the outside is used, whereby all of semiconductor chips having various forms such as a form of a flip chip, a form of a chip using a wire bonding scheme, or the like, may be utilized.

Further, the antenna part and the semiconductor chip are disposed at a position adjacent to each other to be formed integrally with each other, whereby an electrical connection distance between the semiconductor chip and the antenna part may be minimized. Therefore, when the semiconductor package is used in the millimeter wave band (particularly, 60 GHz band), loss generated between the antenna part and the semiconductor chip may be minimized.

Furthermore, the method of manufacturing a semiconductor package according to the present embodiment forms the antenna part as well as the substrate part during the process of forming the substrate part, whereby the number of manufacturing processes and a manufacturing cost may be reduced as compared to the case of the related art in which the antenna is separately manufactured and then coupled to the substrate part.

Further, the semiconductor manufacturing equipment according to the related art is utilized, whereby new equipment investment for manufacturing the semiconductor package may be minimized. In addition, fine circuit patterns are formed on a substrate through the semiconductor manufacturing process, whereby the semiconductor package may be miniaturized and thinned.

Furthermore, the sealing part is grinded to adjust a thickness of the sealing part, whereby characteristics of the antenna part may be adjusted. Therefore, signal matching of the antenna part may be performed during a manufacturing process.

While the present invention has been shown and described in connection with the embodiments, it will be apparent to those skilled in the art that modifications and variations can be made without departing from the spirit and scope of the invention as defined by the appended claims.

What is claimed is:

1. A semiconductor package comprising:
a substrate part, comprising a first material;
a semiconductor chip formed on the substrate part, wherein the semiconductor chip comprises a top surface and side surfaces;
a sealing part formed on, and configured to seal, the semiconductor chip comprising a second material different from the first material, wherein the sealing part directly contacts and seals the top surface and side surfaces of the semiconductor chip;
a groove formed in an outer surface of the sealing part; and
an antenna part, including a radiator, formed in the groove and electrically connected to the semiconductor chip, and
a via connection part configured to penetrate through and directly contact the sealing part and electrically connected to the antenna part, wherein the via connection part is positioned laterally apart from the semiconductor chip.

2. The semiconductor package of claim 1, wherein the antenna part and the semiconductor chip are electrically connected to each other through the via connection part.

3. The semiconductor package of claim 1, wherein the substrate part has fine circuit patterns formed in an inner portion thereof, as a result of a semiconductor manufacturing process.

4. The semiconductor package of claim 1, wherein the semiconductor chip is configured to transceive a high frequency signal in a millimeter wave band, through the antenna part.

5. The semiconductor package of claim 1,
wherein the radiator includes a circuit pattern formed in the groove.

6. The semiconductor package of claim 1, wherein a depth of a portion of the groove differs from a depth of another portion of the groove, and
wherein the depths of the portion and the another portion are measured from a top surface of the sealing part to a bottom surface of the respective portion.

7. A semiconductor package comprising:
a substrate part comprising a first material, and including an electrical connection;
a semiconductor chip formed on the substrate part, wherein the semiconductor chip comprises a top surface and side surfaces;
a sealing part formed on, and configured to seal, the semiconductor chip, wherein the sealing portion comprises a second material different from the first material, wherein the sealing part directly contacts and seals the top surface and side surfaces of the semiconductor chip;
a groove formed in an outer surface of the sealing part on the semiconductor chip;
an antenna part, including a radiator, formed in the groove and electrically connected to the semiconductor chip; and
a via connection part configured to penetrate through the sealing part and electrically connected to the antenna part, wherein a width of the via connection part in the sealing part is greater than a width of the electrical connection in the substrate part, and wherein the via connection part is positioned laterally apart from the semiconductor chip.

8. A semiconductor package comprising:
a substrate part;
a semiconductor chip formed on the substrate part, wherein the semiconductor chip comprises a top surface and side surfaces;
a sealing part formed on, and configured to seal, the semiconductor chip, wherein the sealing portion is made of an Epoxy Mold Compound (EMC), wherein the sealing part directly contacts and seals the top surface and side surfaces of the semiconductor chip;
a groove formed in an outer surface of the sealing part on the semiconductor chip; and
an antenna part, including a radiator, formed in the groove and electrically connected to the semiconductor chip; and
a via connection part configured to penetrate through the sealing part and electrically connected to the antenna part, wherein the via connection part is positioned laterally apart from the semiconductor chip.

* * * * *